(12) United States Patent
Li et al.

(10) Patent No.: US 12,424,566 B2
(45) Date of Patent: Sep. 23, 2025

(54) ELECTROMAGNETIC INTERFERENCE SUPPRESSION CIRCUIT AND INTELLIGENT ELECTRONIC DEVICE

(71) Applicant: Accuenergy (Canada) Inc., Toronto (CA)

(72) Inventors: Ketao Li, Toronto (CA); Shaohang Cui, Toronto (CA); Yan Ding, Toronto (CA); Yufan Wang, Toronto (CA); Liang Wang, Toronto (CA)

(73) Assignee: Accuenergy (Canada) Inc. (CA)

( * ) Notice: Subject to any disclaimer, the term of this patent is extended or adjusted under 35 U.S.C. 154(b) by 764 days.

(21) Appl. No.: 17/837,153

(22) Filed: Jun. 10, 2022

(65) Prior Publication Data

US 2023/0403834 A1 Dec. 14, 2023

(51) Int. Cl.
  *H01L 23/552* (2006.01)
  *H01L 25/16* (2023.01)
  *H03H 1/00* (2006.01)
  *H03H 7/06* (2006.01)

(52) U.S. Cl.
  CPC .......... *H01L 23/552* (2013.01); *H01L 25/167* (2013.01); *H03H 7/06* (2013.01); *H03H 1/0007* (2013.01)

(58) Field of Classification Search
  CPC ... H01L 25/167; H01L 23/552; H03H 1/0007; H03H 7/06
  USPC ................................................. 333/176, 181
  See application file for complete search history.

(56) References Cited

U.S. PATENT DOCUMENTS

| | | | | |
|---|---|---|---|---|
| 5,146,386 A | * | 9/1992 | Learned ................. | H02H 3/023 361/100 |
| 6,212,274 B1 | * | 4/2001 | Ninh ..................... | H04M 19/08 379/93.28 |
| 2009/0141414 A1 | * | 6/2009 | Hsu ........................ | H02H 9/005 361/56 |
| 2009/0173953 A1 | * | 7/2009 | Liu ........................ | H01L 25/167 257/82 |
| 2014/0198418 A1 | * | 7/2014 | Wang .................... | H10D 89/911 361/56 |

OTHER PUBLICATIONS

Shruti Hanumanthaiah, et al., Design Considerations for Electrical Fast Transient (EFT) Immunity. Cypress Embedded in Tomorrow. AN80994. Document No. 001-80994 Rev. *H. 2016. Retrieved Jul. 6, 2022 from https://www.infineon.com/dgdl/Infineon-AN80994_Design_Considerations_for_Electrical_Fast_Transient_(EFT)_Immunity-ApplicationNotes-v09_00-EN.pdf?fileId=8ac78c8c7cdc391c017d072b38ea5000.
PS2706-1. AC Input Response Darlington Transistor SOP Photocoupler. Renesas. Data Sheet. May 14, 2020. R08DS0159EJ0101 Rev.1.0. Retrieved Jul. 6, 2022 from https://www.renesas.com/us/en/document/dst/ps2706-1-data-sheet-0.

* cited by examiner

*Primary Examiner* — Rakesh B Patel
(74) *Attorney, Agent, or Firm* — Dhiraj Jindal; PATENT YOGI LLC

(57) ABSTRACT

Provided in the embodiments are an electromagnetic interference suppression circuit and an intelligent electronic device. The electromagnetic interference suppression circuit comprises at least one ferrite bead located at the input port of the circuit, a transient voltage suppression diode, wherein either terminal of the transient voltage suppression diode is connected with the at least one ferrite bead, a resistor network connected with the transient voltage suppression (Continued)

diode, and an optocoupler with an alternating current input response coupled to resistor network.

6 Claims, 2 Drawing Sheets

ELECTROMAGNETIC INTERFERENCE SUPPRESSION CIRCUIT AND INTELLIGENT ELECTRONIC DEVICE

FIELD OF THE INVENTION

The present disclosure generally relates to an electromagnetic interference suppression circuit for monitoring at least one electrical signal for electrical utility services and, more specifically, to a digital input circuit in an Intelligent Electronic Device, e.g., a digital power meter and energy meter.

BACKGROUND

Digital input is part of an Intelligent Electronic Device (IED), which can be used to count the pulse of external devices such as power meters or detect the status of external devices such as relays and breakers. The pulse counting can work in a 24 VDC (Volts, Direct Current) system and the status detection can work in a 120 VDC system. The digital input circuit needs to be compatible with both 24 VDC and 120 VDC.

In addition, to ensure the immunity of the device to electromagnetic interference, the digital input circuit should comply with the requirement of Electrical Fast Transient (EFT) test defined in the IEC 61000-4-4, the requirement of a surge test defined in the IEC 61000-4-5 and the requirement of insulation defined in the IEC 61010-2.

The EFT is a series of quick, high frequency pulses often caused by arcing. Power line transients occur when an AC/DC connection is made or broken, equipment is powered down, or circuit breakers can be switched.

IEC 61000-4-4 is the International Electrotechnical Commission's immunity standard based on EFT/burst transients. The goal of this standard is to establish a common and reproducible reference for evaluating the immunity of electrical and electronic equipment when subjected to electrical fast transient/bursts on supply, signal, control, and earth ports.

TABLE 1

IEC 61000-4-4 Test Levels

| | Power Supply Terminal | |
|---|---|---|
| Level | Peak Voltage (kV) | Repetition Rate (kHz) |
| 1 | 0.5 | 5 or 100 |
| 2 | 1 | 5 or 100 |
| 3 | 2 | 5 or 100 |
| 4 | 4 | 5 or 100 |
| X[a] | special | special |

The standard defines four severity levels in terms of an open-circuit voltage as a function of the installation environment. Intelligent Electronic Devices need to meet the requirement of the level 4 described in Table 1.

Surges appearing at the ports of electronic equipment are caused by nearby lightning strikes or power system disturbances such as fault clearance or capacitor bank switching. IEC 61000-4-5 is the International Electrotechnical Commission's international standard on surge immunity. Intelligent Electronic Devices need to meet the requirement of the Test level described in Table 2.

TABLE 2

IEC 61000-4-5 Test Levels

| Class | Test Level | Max Peak Current @2Ω |
|---|---|---|
| 0 | 25 V | 12.5 A |
| 1 | 200 V | 250 A |
| 2 | 1 kV | 500 A |
| 3 | 2 kV | 1000 A |
| 4 | 4 kV | 2000 A |

Therefore, designing a circuit to meet the above requirements would be desirable.

SUMMARY OF THE INVENTION

The embodiments of the present disclosure generally relate to an electromagnetic interference suppression circuit for monitoring at least one electrical signal for electrical utility services.

In some embodiments, the present disclosure provides an electromagnetic interference suppression circuit. The electromagnetic interference suppression circuit includes at least one ferrite bead located at the input port of the circuit; a transient voltage suppression diode, wherein either terminal of the transient voltage suppression diode is connected with at least one ferrite bead; a resistor network connected with the transient voltage suppression diode; and an optocoupler with an alternating current input response coupled to resistor network.

In some embodiments of the electromagnetic interference suppression circuit, the optocoupler is disposed on an integrated chip socket soldered on a printed circuit board. In some embodiments, the optocoupler comprises a Darlington-connected phototransistor. In some embodiments, the resistor network comprises at least one anti-surge resistor.

In some other embodiments, the present disclosure provides an intelligent electronic device comprising the electromagnetic interference suppression circuit.

These and other features and aspects of the present disclosure will become fully apparent from the following detailed description of exemplary embodiments, the appended claims and the accompanying drawings.

DETAILED DESCRIPTION

Embodiments of the present disclosure are described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be construed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

As used herein, Intelligent Electronic Devices ("IEDs") can be any device that senses electrical parameters and computes data including, but not limited to, Programmable Logic Controllers ("PLCs"), Remote Terminal Units ("RTUs"), electrical power meters, protective relays, fault recorders, phase measurement units, and other devices which are coupled with power distribution networks to control and manage the distribution or consumption of electrical power.

Figure 1:
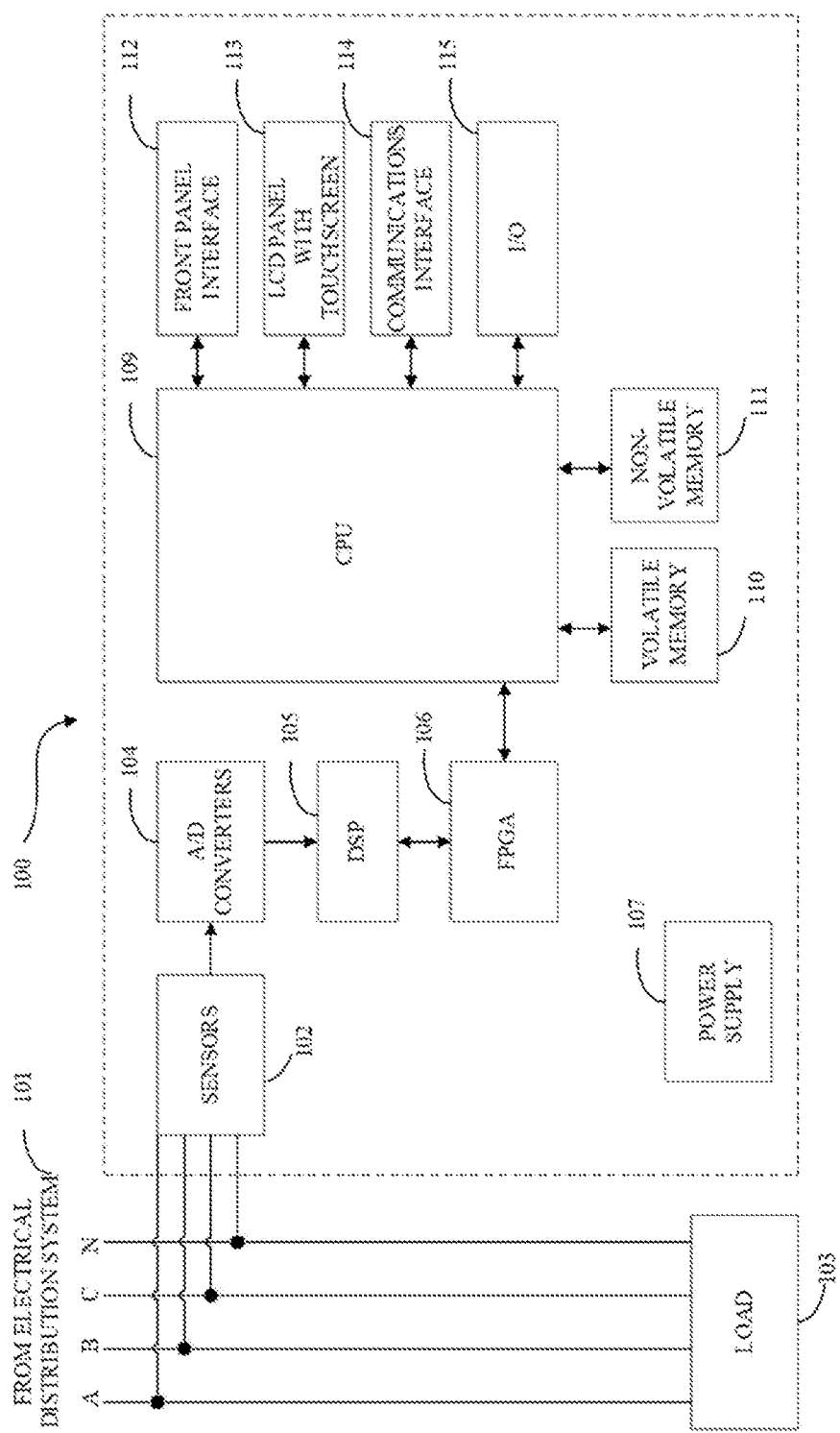
FIG. 1 is a block diagram of an exemplary Intelligent Electronic Device.

The example of FIG. 1 is a block diagram of an Intelligent Electronic Device (IED) 100 for monitoring power usage and power quality for any metered point within a power distribution system.

The IED 100 illustrated in FIG. 1 can include multiple sensors 102 coupled with various phases A, B, C, and N (neutral) of an electrical distribution system 101, multiple analog-to-digital (A/D) converters 104, a power supply 107, volatile memory 110, non-volatile memory 111, a front panel interface 112, and a processing module that can include at least one Central Processing Unit (CPU) and/or one or more Digital Signal Processors (DSP), two of which are shown DSP 105 and CPU 109. The IED 100 can also include a Field Programmable Gate Array (FPGA) 106 which can perform several functions, including acting as a communications bridge for transferring data between the various processors (105 and 109).

The sensors 102 sense electrical parameters, such as voltage and current, on incoming lines (phase A, phase B, phase C, and neutral N) of an electrical power distribution system 101 that can be coupled to at least one load 103 that consumes the provided power. In one embodiment, the sensors 102 include current transformers and potential transformers, where one current transformer and one potential transformer can be coupled to each phase of the incoming power lines. The primary winding of each transformer can be coupled to the incoming power lines and the secondary winding of each transformer can output a voltage representative of the sensed voltage and current. The output of each transformer can be coupled with the A/D converters 104 which can be configured to convert the analog voltage output from the transformer to a digital signal that can be processed by the DSP 105.

A/D converters 104 can be configured to convert an analog voltage output to a digital signal that can be transmitted to a gate array, such as Field Programmable Gate Array (FPGA) 106. The digital signal can then be transmitted from the FPGA 106 to the CPU 109.

The CPU 109 or DSP Processors 105 can be configured to receive digital signals from the A/D converters 104 and perform the necessary calculations to determine power usage and control the overall operations of the IED 100. In some embodiments, the CPU 109 and DSP 105 may be combined into a single processor to serve the functions of each component. In some embodiments, it can be contemplated to use an Erasable Programmable Logic Device (EPLD), a Complex Programmable Logic Device (CPLD), or any other programmable logic device in place of the FPGA 106. In some embodiments, the digital samples, which can be an output from the A/D converters 104 can be sent directly to the CPU 109, effectively bypassing the DSP 105 and the FPGA 106 as a communications gateway.

The power supply 107 can provide power to each component of the IED 100. In one embodiment, the power supply 107 can be a transformer with its primary windings coupled to the incoming power distribution lines to provide a nominal voltage at its secondary windings. In other embodiments, power may be supplied from an independent power source to the power supply 107.

In the embodiment of FIG. 1, the front panel interface 112 is shown coupled to the CPU 109 which can include indicators, switches, and various inputs.

In the embodiment of FIG. 1, the LCD panel with touchscreen 113 is shown coupled to the CPU 109 for interacting with a user and for communicating events, such as alarms and instructions. The LCD panel with touchscreen 113 may provide information to the user in the form of alpha-numeric lines, computer-generated graphics, videos, animations, etc.

An input/output (I/O) interface 115 may be provided for receiving externally generated inputs from the IED 100 and for outputting data, such as serial data, to other devices. In one embodiment, the I/O interface 115 may include a connector for receiving various cards and/or modules that increase and/or change the functionality of the IED 100.

The IED 100 can also include volatile memory 110 and non-volatile memory 111. The volatile memory 110 can store the sensed and generated data for further processing and for retrieval when requested to be displayed at the IED 100 or from a remote location. The volatile memory 110 can include internal storage memory, such as RandomAccess Memory (RAM). The non-volatile memory 111 can include removable memory, such as magnetic storage memory, optical storage memory (such as various types of CD or DVD media), solid-state storage memory (such as a CompactFlash card, a Memory Stick, SmartMedia card, MultiMediaCard [MMC], SD [Secure Digital] memory), or any other memory storage that exists currently or can exist in the future. Such memory can be used for storing historical trends, waveform captures, event logs (including timestamps), and stored digital samples for later download to a client application, webserver, or PC application.

In a further embodiment, the IED 100 can include a communication interface 114, also known as a network interface, for enabling communications between the IED, or meter, and a remote terminal unit or programmable logic controller and other computing devices, microprocessors, desktop computers, laptop computers, other meter modules etc. The communication interface 114 may be a modem, Network Interface Card (NIC), wireless transceiver, or another interface. The communication interface 114 can operate with hardwired and/or wireless connectivity. A hardwired connection may include, but is not limited to, physical cabling (such as parallel cables serial cables, RS232, RS485, USB cables, or Ethernet) and an appropriately configured communication port. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocols, communication architecture, or systems currently existing or to be developed for wirelessly transmitting data.

The IED 100 may communicate to a server or other computing device via the communication interface 114. The IED 100 may be connected to a communications network (such as the Internet) by any means. For example, a hard-wired or wireless connection, such as a dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server can communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocols. The server may further include a storage medium for storing the data received from at least one IED or meter and/or storing data to be retrieved by the IED or meter.

In an additional embodiment, when a power event occurs, such as a voltage surge, voltage sag, or current short circuit, the IED 100 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform can also allow the CPU 109 to compute other electrical parameters such as harmonics, magnitudes, symmetrical components, and phasor analysis.

In a further embodiment, the IED 100 can execute an e-mail client and can send notification e-mails to the utility or directly to the customer when a power quality event occurs. This allows utility companies to dispatch crews to repair the condition. The data generated by the meters may be used to diagnose the cause of the condition. The data can be transferred through the infrastructure created by the electrical power distribution system. The e-mail client can utilize POP3 or another standard e-mail protocol.

The techniques of the present disclosure can be used to automatically maintain program data and provide field-wide updates upon which IED firmware and/or software can be upgraded. An event command can be issued by a user, on a schedule, or through a digital communication that can trigger the IED 100 to access a remote server and obtain the new program code. This can ensure that program data will be maintained, assuring the user that all information can be displayed identically on all units.

It is to be understood that the present disclosure may be implemented in various forms of hardware, software, firmware, special purpose processors, or a combination thereof. The IED 100 can also include an operating system and application programs. The various processes and functions described herein may either be part of an application program (or a combination thereof) which may be executed via the operating system.

Because some of the system components and methods depicted in the accompanying figures may be implemented using either software or firmware, it is to be further understood that the actual connections between the system components (or the process steps) may differ depending on the specific way the present disclosure can be programmed. Given the teachings of the present disclosure provided herein, one of ordinary skill in the related art will be able to contemplate these and similar implementations or configurations of the present disclosure.

Figure 2:
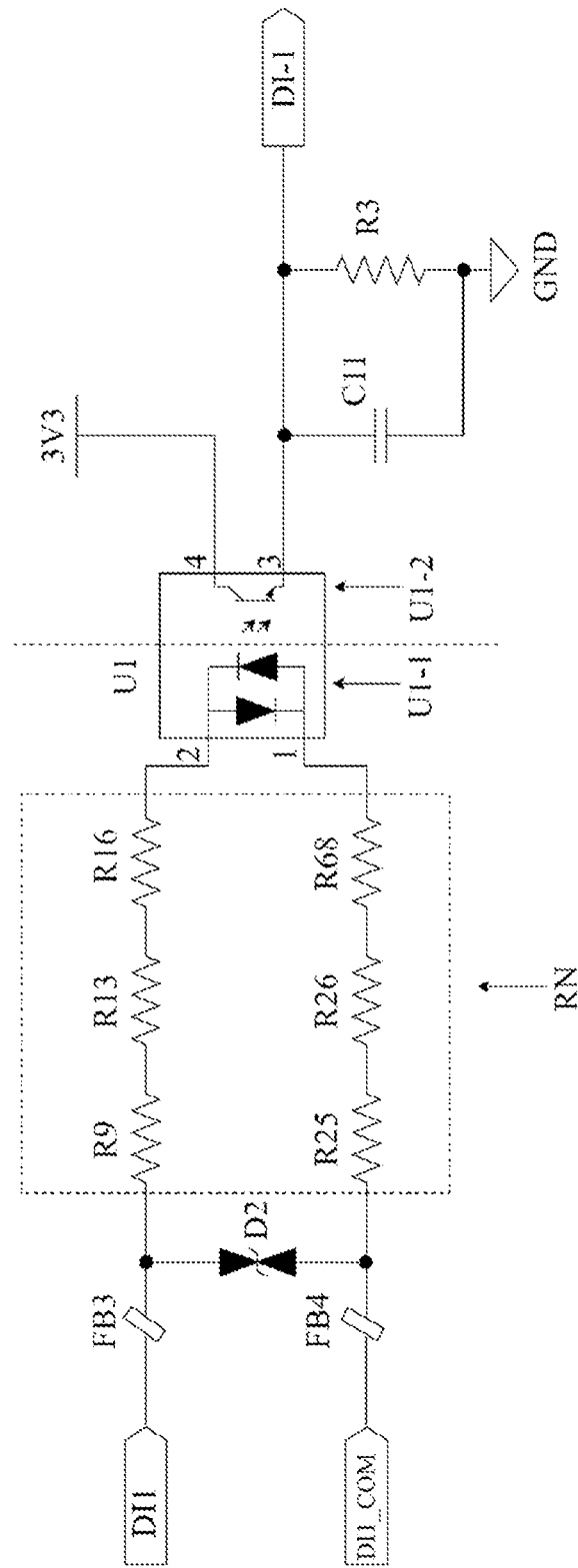
FIG. 2 is a schematic diagram of an electromagnetic interference suppression circuit in an Intelligent Electronic Device.

The example of FIG. 2 is a schematic diagram of electromagnetic interference) suppression circuit 200 in an Intelligent Electronic Device.

The circuit 200 can be part of the input/output interface 115 in FIG. 1 and can include an input DI1 and an output DI-1. The DI1 can be a digital electrical signal input for receiving externally generated inputs and the DI1_COM can be a common ground for DI1. In one embodiment, the digital electrical signal received by the DI1 may be a status signal from external devices such as relays and breakers, or KYZ pulse signal used to transmit instantaneous energy use information. The circuit 200 can be used to improve the EFT and surge immunity of the digital electrical signal. On the other hand, the circuit 200 can provide a flexible way to support both pulse counting and status detection. In one embodiment, the pulse counting can work in a 24 VDC (Volts, Direct Current) system and the status detection can work in a 120 VDC system.

The DI-1 can be a digital electrical signal output to at least one of an FPGA 106, DSP 105, and CPU 109. After the digital signal from DI-1 can be processed, the status of external devices such as relays and breakers or KYZ pulse signal can be detected.

Ferrite beads FB3 and FB4 can be located at the input ports of the circuit 200, which can suppress the high-speed transients in the digital signal received from the input DI1. A ferrite bead can be a type of choke that suppresses high-frequency electronic noise in electronic circuits. Ferrite beads employ high-frequency current dissipation in a ferrite ceramic to build high-frequency noise suppression devices. Ferrite beads FB3 and FB4 can also be used to flatten the peak of the digital signal received from the input DI1 and reduce the peak pulse power dissipation of a Transient-voltage-suppression diode (TVS) D2. The TVS can be an electronic component used to protect electronics from voltage spikes induced on connected wires. A resistor network RN comprising six anti-surge resistors R9, R13, R16, R25, R26 and R68 can be used to set up the operating point of the circuit 200.

Component U1 can be an optocoupler. The optocoupler can be a semiconductor device that allows an electrical signal to be transmitted between two isolated circuits. Component U1 can include a LED (Light-emitting diode) U1-1 and a photosensitive device U1-2. The LED U1-1 can be used to emits infrared light and the photosensitive device U1-2 can be used to detects light from the LED. Both the LED and photo-sensitive device can be enclosed in a light-tight body or package with metal legs for the electrical connections as shown.

In one embodiment, the LED U1-1 can be a diode for alternating current. This feature can make it easy to meet the bidirectional input requirement and save the additional bridge rectifier.

In another embodiment, the photosensitive device can include a Darlington-connected phototransistor. The Darlington-connected phototransistor can provide up to about 2,000% of a current transfer ratio and sense input current from 0.2 mA to 5 mA. This feature can provide a wide voltage input range.

Replacing burned components on a Printed Circuit Board (PCB) can be highly inconvenient. However, optocouplers can be used for securing expensive components. In case of a malfunction, the optocoupler burns and the rest of the circuit may not be affected. In one embodiment, the U1 may be placed in an Integrated Chip socket instead of directly soldered on the circuit so it can always be replaced easily when it burns.

Embodiments in the present disclosure have been described in an illustrative manner. It is to be understood that the terminology that has been used is intended for descriptive purposes only rather than of limitation of the usages. Many modifications and variations to the electromagnetic interference suppression circuit and IED configuration are possible in light of the previous examples. Therefore, within the scope of the appended claims, the embodiments can be practiced in ways that are other than specifically described.

What is claimed is:

1. An electromagnetic interference suppression circuit comprising:
   at least one ferrite bead disposed at an input port of the circuit;
   a transient voltage suppression diode, wherein a terminal of the transient voltage suppression diode is connected with the at least one ferrite bead;
   a resistor network connected with the transient voltage suppression diode, wherein the resistor network comprises at least one anti-surge resistor; and
   an optocoupler with an alternating current input response coupled to the resistor network.

2. The circuit of claim 1, wherein the optocoupler is disposed on an integrated chip socket soldered on a printed circuit board.

3. The circuit of claim 1, wherein the optocoupler comprises a Darlington-connected phototransistor.

4. An intelligent electronic device (IED) comprising an electromagnetic interference suppression circuit, wherein the circuit comprising:
   at least one ferrite bead disposed at an input port of the circuit;
   a transient voltage suppression diode, wherein either terminal of the transient voltage suppression diode is connected with the at least one ferrite bead;
   a resistor network connected with the transient voltage suppression diode, wherein the resistor network comprises at least one anti-surge resistor; and
   an optocoupler with an alternating current input response coupled to the resistor network.

5. The device of claim 4, wherein the optocoupler comprises a Darlington-connected phototransistor.

6. The device of claim 4, wherein the optocoupler is disposed on an integrated chip socket soldered on a printed circuit board.

* * * * *